US009148169B2

(12) United States Patent
Kabir et al.

(10) Patent No.: US 9,148,169 B2
(45) Date of Patent: Sep. 29, 2015

(54) MULTIPLE BIT SIGMA-DELTA MODULATOR WITH A COMMON MODE COMPENSATED QUANTIZER

(71) Applicants: Mohammad Nizam Kabir, Tempe, AZ (US); Brandt Braswell, Chandler, AZ (US); Mariam Hoseini, Tempe, AZ (US)

(72) Inventors: Mohammad Nizam Kabir, Tempe, AZ (US); Brandt Braswell, Chandler, AZ (US); Mariam Hoseini, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/189,841

(22) Filed: Feb. 25, 2014

(65) Prior Publication Data

US 2015/0244393 A1    Aug. 27, 2015

(51) Int. Cl.
*H03M 3/00* (2006.01)
(52) U.S. Cl.
CPC .................................. *H03M 3/464* (2013.01)
(58) Field of Classification Search
CPC ............. H03K 5/08; H03K 5/24; H03K 5/26; H03M 1/365; H03M 1/0604; H03M 1/0682; H03M 3/464
USPC ........................... 341/130–155; 375/224, 371
See application file for complete search history.

(56) References Cited

U.S. PATENT DOCUMENTS

| 4,518,870 | A | * | 5/1985 | Banu ................................ 327/73 |
| 4,797,374 | A | * | 1/1989 | Scott et al. ....................... 438/40 |
| 5,729,178 | A | * | 3/1998 | Park et al. ...................... 330/258 |
| 7,079,068 | B2 | | 7/2006 | Clement et al. |
| 8,164,159 | B1 | * | 4/2012 | Armstrong et al. ........... 257/531 |
| 8,773,557 | B2 | * | 7/2014 | Kato et al. ..................... 348/294 |
| 2010/0271521 | A1 | * | 10/2010 | Kawaguchi et al. .......... 348/302 |

OTHER PUBLICATIONS

S. Pavan et al., "A Power Optimized Continuous-Time ΔΕ ADC for Audio Applications," IEEE J. Solid-State Circuits, vol. 43, No. 2, pp. 351-360, Feb. 2008.
20-mW 640-MHz CMOS Continuous-Time ΔΕ ADC With 20-MHz Signal Bandwidth, 80-dB Dynamic Range and 12-bit ENOB, Gerhard Mitteregger, Member, IEEE, Christian Ebner, Member, IEEE, Stephan Mechnig, Member, IEEE, Thomas Blon, Member, IEEE, Christophe Holuigue, and Ernesto Romani, Member, IEEE Journal of Solid-State Circuits, Vol. 41, No. 12, Dec. 2006.
A 3.1 mW Continuous-Time ΔΕ Modulator With 5-Bit Successive approximation Quantizer for WCDMA Mohammad Ranjbar, Member, IEEE, Arash Mehrabi, Member, IEEE, Omid Oliaei, Senior Member, IEEE, and Frederic Carrez, IEEE Journal of Solid-State Circuits, vol. 45, No. 8, Aug. 2010.
Straayer, M. Z., et al., "A 12-Bit, 10-MHz Bandwidth, Continuous-Time ΔΕ ADC With a 5-Bit, 950-MS/s VCO-Based Quantizer," IEEE J. Solid-State Citcuits, vol. 43, No. 4, Apr. 2008, pp. 805-814.
Taylor, Gerry, et al., "A Mostly-Digital Variable-Rate Continuous-Time Delta-Sigma Modulator ADC," IEEE J. Solid-State Circuits, vol. 45, No. 12, Dec. 2010, pp. 2634-2646.

* cited by examiner

*Primary Examiner* — Lam T Mai
(74) *Attorney, Agent, or Firm* — Quarles & Brady LLP

(57) ABSTRACT

A quantizer for an analog to digital converter has an input for receiving an analog input signal. A detector senses a common mode voltage component of the input signal. A reference voltage source produces a plurality of reference voltages. A voltage source biases the reference voltage source in response to the sensed common mode voltage component. Therefore, the common mode voltage in the input signal establishes the common mode voltage of the reference voltage source. A plurality of comparators are connected to the reference voltage source, wherein each of the plurality of comparators compares the input signal to one of the plurality of reference voltages and produces a output bit denoting a result of the comparing.

22 Claims, 2 Drawing Sheets

MULTIPLE BIT SIGMA-DELTA MODULATOR WITH A COMMON MODE COMPENSATED QUANTIZER

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND

1. Field of Use

The present disclosure relates to a multiple bit sigma-delta modulator, such as used for analog to digital converters; and more particularly to the quantizer employed in that modulator.

2. Description of the Related Art

FIG. 1 depicts a multiple bit sigma-delta modulator type analog to digital converter (ADC). In this type of converter, the input signal is applied to a summing stage 11 that is configured to generate a signal as a difference between the analog input signal and a feedback signal. The output of the summing stage is applied to a loop filter 12 that shapes the quantization noise thereby producing a filtered signal. The filtered result is applied as an input signal to a multiple bit quantizer 14 configured to quantize that input signal and apply the result to an encoder 15 which produces a digital value. That digital value is applied to a decimation filter 16. The output of the quantizer 14 also is applied to a feedback circuit that includes a digital to analog converter 18, the analog output of which is fed to the summing stage 11 as the feedback signal.

A concern with respect to this type of ADC is the effect on performance due to common mode voltages when the device operates at relatively low supply voltage levels. The quantizer 14 is typically implemented by a plurality of voltage comparators which compare the signal from the loop filter 12 to different reference voltages produced by a voltage divider formed by a resistor ladder. Each comparator has a pair of differential input lines across which the input signal being processed is applied. The output of a particular one of those comparators has a true state when the following expression is satisfied:

$$((V_{INP}+V_{CM\_IN})-(V_{INM}+V_{CM\_IN}))>((V_{REFP}+V_{CM\_REF})-(V_{REFM}+V_{CM\_REF})) \quad (1)$$

where $V_{INP}$ and $V_{INM}$ are voltages present on the two input signal lines of the quantizer, $V_{REFP}$ and $V_{REFM}$ are reference voltages for comparing to $V_{INP}$ and $V_{INM}$, respectively, $V_{CM\_IN}$ is the common mode voltage on the input lines, and $V_{CM\_REF}$ is the common mode voltage component of the reference voltages.

When a voltage comparator operates at a relatively high supply voltage, all the terms of equation (1) are determined. In that case, the two common mode input voltage variables ($V_{CM\_IN}$) arithmetically cancel each other and the two common mode reference voltage variables ($V_{CM\_REF}$) arithmetically cancel each other. Thus the comparator trips to a true state in response to the input signals satisfying the following relationship:

$$(V_{INP}-V_{INM})>(V_{REFP}-V_{REFM}) \quad (2)$$

which is based solely on the input voltage levels and the reference voltage levels.

However, when the voltage comparators operate at a relatively low supply voltage, as may be required for some circuit applications, some of the comparators may not determine all the terms of equation (1) because their biasing requirements are not fulfilled. A particular comparator may not produce values for the $(V_{INM}+V_{CM\_IN})$ and the $(V_{REFM}+V_{CM\_REF})$ components of that equation. As a result, the common mode voltages do not cancel and that comparator transitions to a true state when the following relationship is satisfied:

$$(V_{INP}+V_{CM\_IN})>(V_{REFP}+V_{CM\_REF}) \quad (3).$$

Another comparator may not produce values for the $(V_{INP}+V_{CM\_IN})$ and the $(V_{REFP}+V_{CM\_REF})$ components of equation (1). Here too, the common mode voltages do not cancel and the comparator transitions to a true state when the following relationship is satisfied:

$$(V_{INM}+V_{CM\_IN})>(V_{REFM}+V_{CM\_REF}) \quad (4).$$

In both situations represented by equations (3) and (4), the comparator operation is affected by the common mode voltage components of the input signal and the reference voltages. Therefore, the comparator operation is not defined by expression (2).

It is therefore desirable to remove the effects that the common mode input voltage ($V_{CM\_IN}$) and the common mode reference voltage ($V_{CM\_REF}$) have on ADC performance when the quantizer operates at a relatively low supply voltage. Doing so results in the comparator having an output state based solely on the input voltage levels and the reference voltage levels.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and descriptions and details of well-known features and techniques may be omitted to avoid unnecessarily obscuring the invention. Elements in the figures are illustrated for simplicity and clarity and have not necessarily been drawn to scale. In fact, the dimensions of some of the elements or regions in the figures may be exaggerated relative to other elements or regions to improve understanding of embodiments of apparatus. The figures along with the detailed description are incorporated and form part of the specification and serve to further illustrate examples, embodiments and the like, and explain various principles and advantages, in accordance with the present disclosure, where.

DETAILED DESCRIPTION

Figure 2:
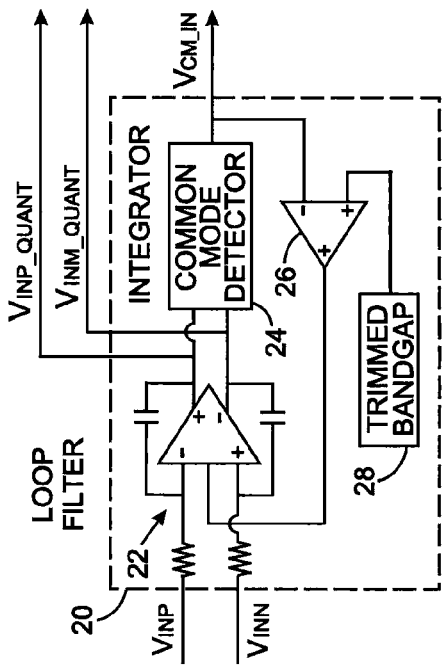
FIG. 2 is a schematic diagram of a continuous time type loop filter according to an embodiment of the present disclosure.

The following detailed description is exemplary in nature and is not intended to limit the invention or the application and uses of the same. Furthermore, there is no intention to be bound by any expressed or implied theory presented in the preceding technical field, background, or the following detailed description.

The terms "first," "second," and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that an apparatus, article, process, or method, that comprises a list of elements is not necessarily limited to those elements, but may include other elements not expressly listed or inherent to such a apparatus, article, process, or method. The term "coupled," as used herein, is defined as directly or indirectly connected in an electrical or non-electrical manner. The terms "substantial" and "substantially" herein mean sufficient to accomplish the stated purpose in a practical manner and that minor imperfections or variation, if any, are not significant for the stated purpose.

Embodiments of ADCs and methods disclosed herein remove the effects that the common mode input voltage ($V_{CM\_IN}$) and the common mode reference voltage ($V_{CM\_REF}$) have on ADC performance when the quantizer operates at a relatively low supply voltage. Doing so results in the ADC comparators having output states based solely on the input voltage levels and the reference voltage levels."

With reference to FIG. 2, the analog input signal being processed is applied across the two inputs $V_{INP}$ and $V_{INN}$ of a loop filter 20, which in the present example is a continuous time loop filter, however other types of loop filters may be used. The loop filter 20 includes at least one balanced integrator 22. For filters with multiple integrators, integrator 22 represents the final one in the signal processing chain. The output of the loop filter 20 is produced on lines ($V_{INP\_QUANT}$ and $V_{INM\_QUANT}$) and also is applied to the inputs of a common mode detector 24. The common mode detector 24 is a conventional circuit that senses the common mode voltage component in the signal from the loop filter 20. The result of the common mode detector 24 is an output voltage $V_{CM\_IN}$ that is an indication of that common mode voltage component of the input signal being processed.

The common mode voltage $V_{CM\_IN}$ is applied to the inverting input of a feedback amplifier 26 which receives a conventional trimmed band gap voltage at the non-inverting input. The output of the feedback amplifier 26 is coupled to an input of the balanced integrator 22. Thus the continuous time loop filter 20 not only produces a differential output signal, but also a voltage corresponding to the common mode voltage on the inputs.

Figure 3:
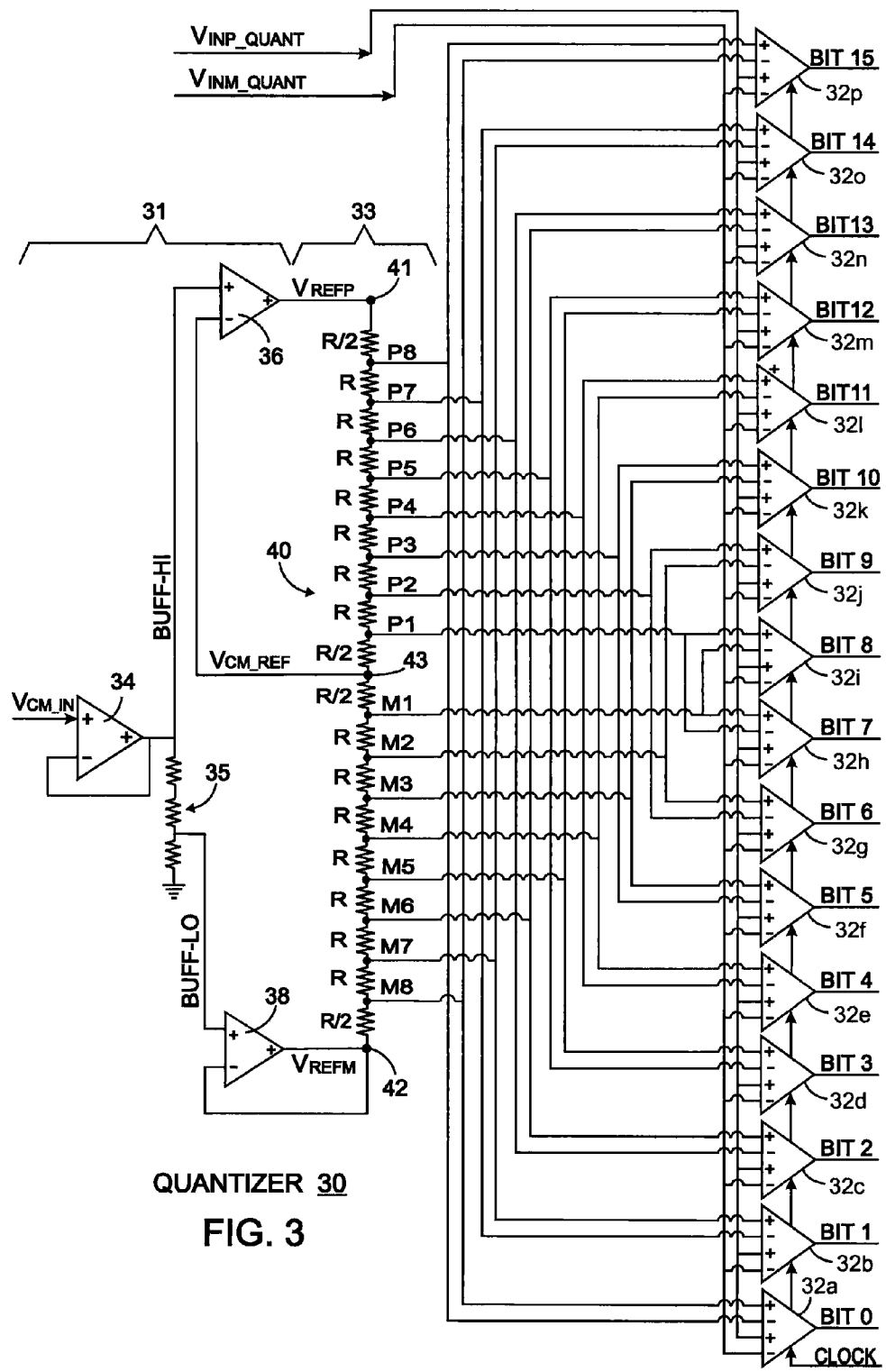
FIG. 3 is a schematic diagram of a quantizer according to an embodiment of the present disclosure.

Referring to FIG. 3, the outputs from the continuous time loop filter 20 are applied as inputs to a quantizer 30. The two signal lines $V_{INP\_QUANT}$ and $V_{INM\_QUANT}$ are connected to the inverting and non-inverting signal inputs, respectively, of a plurality of comparators 32. In the present example, the quantizer 30 is a sixteen bit device which therefore has sixteen comparators 32a-32p. The input common mode voltage $V_{CM\_IN}$ produced by the loop filter 20 is fed to a biasing voltage source 31. Specifically this common mode voltage $V_{CM\_IN}$ is applied to the non-inverting input of an input operational amplifier (op amp) 34 having an output directly connected to its inverting input. The output signal (BUFF-HI) from the input op amp 34 also is applied to the non-inverting input of a first reference voltage op amp 36 and to one end of a source voltage divider 35. The source voltage divider 35 has a node at which a voltage (BUFF-LO) is produced and fed to the non-inverting input of a second reference voltage op amp 38. The output of the second reference voltage op amp 38 is connected directly to its inverting input. The three operational amplifiers 34, 36 and 38 and the source voltage divider 35 form the biasing voltage source 31.

The biasing voltage source 31 produces voltages that bias a reference voltage source 33. The first reference voltage op amp 36 produces an output voltage designated $V_{REFP}$ that is applied to a first (or top) node 41 at one end of a reference voltage divider in the form of a resistor ladder 40. The output voltage designated $V_{REFM}$ produced by the second reference voltage op amp 38 is applied to a second (or bottom) node 42 at another end of the resistor ladder 40. Thus the resistor ladder 40 is biases by supply voltages $V_{REFP}$ and $V_{REFM}$ that are derived from the common mode voltage $V_{CM\_IN}$ of the signal being digitized by the ADC.

The resistor ladder 40 in the present example includes eighteen fixed resistors connected in series between the first and second nodes 41 and 42. The resistor ladder 40 has a center node 43 in the middle of that series, i.e., at the mid resistance point. Thus, there are nine resistors connected in series between the first node and the center node 43 and another set of nine resistors connected in series between the center node and the second node 42. The resistors connected immediately to the first node 41, both sides of the center node 43 and the second node 42 have a resistance denoted as R/2. The remaining resistors have a resistance designated R. Therefore, each resistor connected directly to one of the three nodes 41, 42 and 43 has a resistance that is one-half the resistance of the remaining resistors in the resistor ladder 40. Except for the center node 43, the nodes between adjacent resistors form reference nodes that are connected to output lines of the resistor ladder 40. The reference nodes between the first node 41 and the center node 43 are designated P1, P2, P3, P4, P5, P6, P7, and P8, respectively, going from the center node toward the first node. The reference nodes between the center node 43 and the second node 42 are designated M1, M2, M3, M4, M5, M6, M7, and M8, respectively, going from the center node toward the second node.

The voltages produced at the designated intermediate nodes of the resistor ladder 40 provide the reference voltages for the comparators 32a-32p. For example a two intermediate nodes P1 and M1 on opposite sides of the center node 43 provide the plus and minus reference voltages for the two middle comparators, i.e., eighth and ninth comparators 32h and 32i. Specifically, the reference voltage at node P1 is applied to the plus reference voltage input of the ninth comparator 32i and to the minus reference voltage input of the eighth comparator 32h. The reference voltage at node M1 is applied to the plus reference voltage input of the eighth comparator 32h and to the minus reference voltage input of the ninth comparator 32i. The reference voltages at the remaining pairs of like numbered nodes P and M going in opposite directions from the center node 43 in the resistor ladder are applied in the same manners to associated pairs of op amps 32 on opposite sides of the middle comparators 32h and 32i in the quantizer 30. Thus the comparator 32a for the least significant BIT0 and the comparator 32p for the most significant BIT15 receive the reference voltages P8 and M8 from the resistor ladder 40. In each instance, the reference voltage at the associated P node is applied to the plus reference voltage input of the comparator above the middle comparators 32h and 32i (i.e., to the more significant bit comparator in the pair) and to the minus voltage input of the comparator below the middle bit comparators 32h and 32i (i.e., to the less significant bit comparator in the pair). Furthermore, the voltage at the M node in the resistor ladder 40 is applied to the minus input of the more significant bit comparator in the pairs and to the positive reference voltage input of the less significant bit comparator in the pair.

The center node 43 in the resistor ladder 40 is connected directly to the inverting input of the first reference voltage op amp 36. The voltage at the center node 43 is designated as the common mode voltage of the resistor ladder $V_{CM\_REF}$. The reference voltage source 33 is configured so that the common mode voltage of the resistor ladder is equal to the common mode voltage $V_{CM\_IN}$ of the input signal to the quantizer 30.

Figure 4:
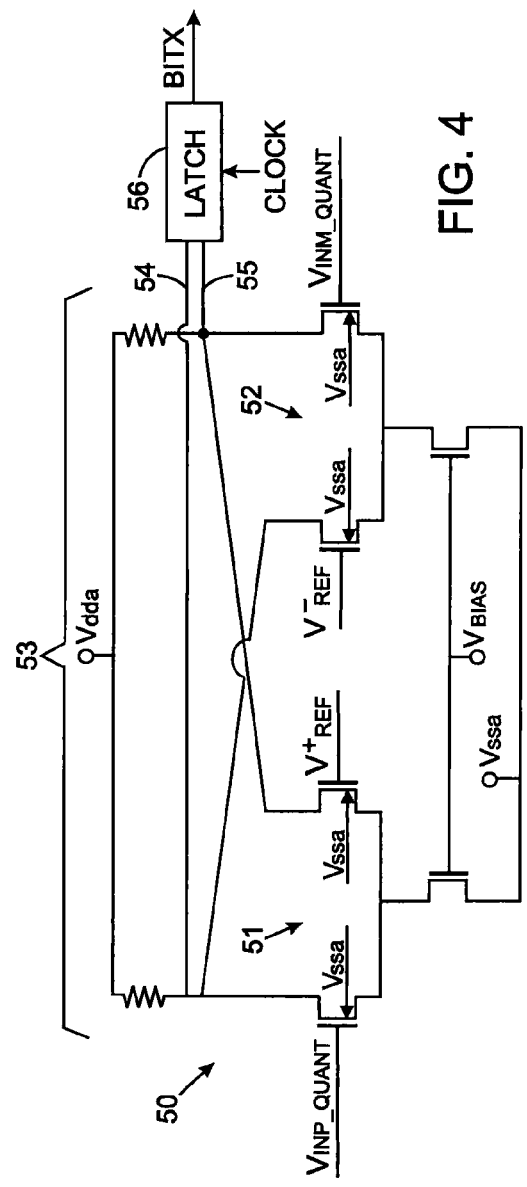
FIG. 4 is a schematic diagram of an exemplary comparator according to an embodiment of the present disclosure, that may be used in the quantizer and which includes a preamplifier and an output latch.

FIG. 4 shows an example of a circuit 50 which can be employed for each of the comparators 32a-32p. The comparator circuit 50 includes a preamplifier stage 53 comprising first and second differential amplifiers 51 and 52. The output of the preamplifier stage 53 on lines 54 and 55 is applied to a latch 56 that is controlled by a clock signal (CLOCK). The latch 56 produces the output bit of the comparator designated BITX, where X is the number from 0 to 15 designating the specific output bit of the quantizer 30 that is produced by that particular comparator.

Figure 1:
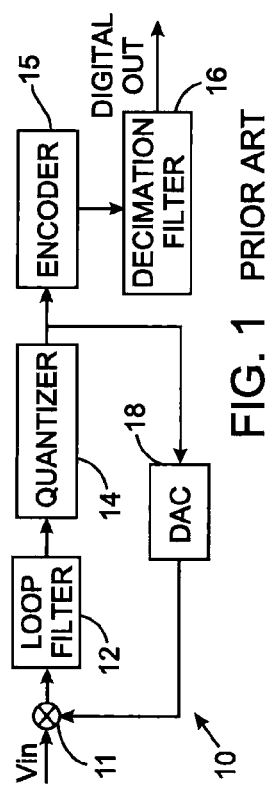
FIG. 1 is a high level block diagram of a multiple bit sigma-delta modulator type analog to digital converter.

As shown in FIG. 1, the output bits BIT0-BIT15 from the comparators 32a-32p, that define 17 output states, are applied to the inputs of the encoder 15 which employs those output bits to derive a set of five bits defining the digital output value of the analog to digital converter 10.

The present quantization technique tracks the common mode voltage ($V_{CM\_IN}$) in the output from the loop filter 20 and sets the common mode voltage ($V_{CM\_REF}$) of the reference voltage resistor ladder 40 to that loop filter common mode voltage. Specifically, the quantizer 30 employs the common mode voltage ($V_{CM\_IN}$) of the signal being digitized to derive the supply voltages $V_{REFP}$ and $V_{REFM}$ for the voltage ladder 40. From those supply voltages, the voltage ladder produces the plurality of reference voltages that are applied to the plurality of comparators 32a-32p. In other words, the reference voltage levels are generated using the common mode voltage from the loop filter 20. This results in the common mode voltage $V_{CM\_IN}$ of the input signal to the quantizer and common mode voltage $V_{CM\_REF}$ of the reference voltages being the same, and thus the effects that result from those common mode voltages tend to cancel out. Therefore, those common mode voltages have negligible effect on operation of the quantizer 30 and the resultant output bits (BIT0-BIT15) even when the quantizer operates at a relatively low supply voltage.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A method for converting an analog input signal into multiple digital bits using a quantizer, said method comprising:
    detecting a common mode voltage of the analog input signal;
    providing a reference voltage source for producing a plurality of reference voltages;
    biasing the reference voltage source in response to the common mode voltage; and
    performing a plurality of comparisons of the analog input signal to each of the plurality of reference voltages, wherein each comparison produces a quantizer output bit.

2. The method as recited in claim 1, further comprising encoding the quantizer output bits to produce a digital value.

3. The method as recited in claim 1, wherein providing a reference voltage source comprises providing a resistor ladder that has a plurality of resistors connected in series between a first node and a second node, and defining a plurality of reference nodes each located between two adjacent resistors in the resistor ladder.

4. The method as recited in claim 3, wherein biasing the reference voltage source comprises applying a first voltage derived from the common mode voltage to the first node; and applying a second voltage derived from the common mode voltage to the second node.

5. The method as recited in claim 4, wherein the first voltage also is derived from a voltage at a mid resistance point in the resistor ladder.

6. The method as recited in claim 4, wherein the first voltage also is derived from a voltage at given node between two adjacent resistors in the resistor ladder.

7. The method as recited in claim 1, wherein biasing the reference voltage source results in a reference common mode voltage of the reference voltage source tracks changes in the common mode voltage.

8. A quantizer for an analog to digital converter that has an input for receiving an analog input signal and a detector for producing an indication of a common mode component of the input signal, said quantizer comprising:
    a reference voltage source for producing a plurality of reference voltages;
    a biasing voltage source for biasing the reference voltage source in response to the indication produced by the detector; and
    a plurality of comparators connected to the reference voltage source, wherein each of the plurality of comparators is for comparing the input signal to one of the plurality of reference voltages and producing a quantizer output bit denoting a result of the comparing.

9. The quantizer as recited in claim 8, wherein the reference voltage source comprises a resistor ladder formed by a plurality of resistors connected in series between a first node and a second node and having a plurality of reference nodes each located between two adjacent resistors in the resistor ladder.

10. The quantizer as recited in claim 9, wherein the common mode component of the input signal is a common mode voltage, and a voltage at a mid resistance point in the resistor ladder is substantially equal to the common mode voltage.

11. The quantizer as recited in claim 9, wherein the biasing voltage source comprises a first reference voltage operational amplifier having one input to which a first voltage derived from the indication is applied and having an output connected to the first node; and a second reference voltage operational amplifier having one input to which a second voltage derived from the indication is applied and having an output connected to the second node.

12. The quantizer as recited in claim 11, wherein the first reference voltage operational amplifier further comprises another input connected to a node between two adjacent resistors in the resistor ladder.

13. The quantizer as recited in claim 11, wherein the reference voltage source further comprises a mid resistance point in the resistor ladder; and the first reference voltage operational amplifier further comprises another input connected to the mid resistance point.

14. The quantizer as recited in claim 11, wherein the output bit from each of the plurality of comparators is applied to an encoder that produces a digital output value.

15. An analog to digital converter comprising:
   an input for receiving an analog input signal;
   a filter for filtering the analog input signal and producing a filtered input signal; and
   a quantizer connected to receive the filtered input signal and comprising:
      (a) a detector for producing an indication of a common mode component of the input signal,
      (b) a reference voltage source for producing a plurality of reference voltages,
      (c) a biasing voltage source for biasing the reference voltage source in response to the indication produced by the detector, and
      (d) a plurality of comparators connected to the reference voltage source, wherein each of the plurality of comparators is for comparing the input signal to one of the plurality of reference voltages and producing a quantizer output bit denoting a result of the comparing.

16. The analog to digital converter as recited in claim 15, further comprising an encoder operatively connected to receive the quantizer output bit from each of the plurality of comparators and produce a digital value.

17. The analog to digital converter as recited in claim 16 further comprising a decimation filter operatively connected to receive the digital value from the encoder.

18. The analog to digital converter as recited in claim 15, wherein the reference voltage source comprises a resistor ladder formed by a plurality of resistors connected in series between a first node and a second node and having a plurality of reference nodes each located between two adjacent resistors in the resistor ladder.

19. The analog to digital converter as recited in claim 18, wherein the biasing voltage source comprises a first reference voltage operational amplifier having one input to which a first voltage derived from the indication is applied and having an output connected to the first node; and a second reference voltage operational amplifier having one input to which a second voltage derived from the indication is applied and having an output connected to the second node.

20. The analog to digital converter as recited in claim 19 wherein the first reference voltage operational amplifier further comprises another input connected to a given node between two adjacent resistors in the resistor ladder.

21. The analog to digital converter as recited in claim 20, wherein the common mode component of the input signal is a common mode voltage, and a voltage at the given node in the resistor ladder is substantially equal to the common mode voltage.

22. The analog to digital converter as recited in claim 19, wherein the reference voltage source further comprises a mid resistance point in the resistor ladder; and the first reference voltage operational amplifier further comprises another input connected to the mid resistance point.

\* \* \* \* \*